(12) United States Patent
Wang et al.

(10) Patent No.: US 8,680,815 B2
(45) Date of Patent: *Mar. 25, 2014

(54) METHOD AND APPARATUS FOR ASSESSING BATTERY STATE OF HEALTH

(75) Inventors: John S. Wang, Los Angeles, CA (US); Ping Liu, Irvine, CA (US); Shuoqin Wang, Westlake, CA (US); Souren Soukiazian, Burbank, CA (US); Mark W. Verbrugge, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 600 days.

This patent is subject to a terminal disclaimer.

(21) Appl. No.: 12/916,743

(22) Filed: Nov. 1, 2010

(65) Prior Publication Data

US 2012/0105069 A1    May 3, 2012

(51) Int. Cl.
*H02J 7/00* (2006.01)

(52) U.S. Cl.
USPC .......................................................... 320/132

(58) Field of Classification Search
USPC .......................................... 320/132; 324/432
See application file for complete search history.

(56) References Cited

U.S. PATENT DOCUMENTS

| | | |
|---|---|---|
| 7,768,233 B2 | 8/2010 | Lin et al. |
| 2006/0284600 A1 | 12/2006 | Verbrugge |
| 2007/0172723 A1 | 7/2007 | Chen |
| 2009/0091299 A1 | 4/2009 | Lin et al. |
| 2009/0104510 A1 | 4/2009 | Fulop et al. |
| 2010/0033132 A1 | 2/2010 | Nishi et al. |

FOREIGN PATENT DOCUMENTS

CN    1437031 A    8/2003

OTHER PUBLICATIONS

Verbrugge, M.; Generalized Recursive Algorithm for Adaptive Multiparameter Regression; J.Electrochemical Society, 153(1) A187-A201 (2006); 2007.
Verbrugge, M.; Adaptive, multi-parameter battery state estimator with optimized time-weighting factors; J Appl Electrochem; DOI 10.1007/d10800-007-9291-7 (2007); USA.
U.S. Appl. No. 12/916,735, filed Nov. 1, 2010, Verbrugge, et al.

*Primary Examiner* — Edward Tso
*Assistant Examiner* — Robert Grant

(57) ABSTRACT

A method for monitoring a lithium-ion battery cell includes monitoring a battery cell voltage and a corresponding charge capacity of the battery cell during an electric power event which may include either an electric power charge event or an electric power discharge event. A measured charge-capacity-derivative is determined by differentiating the charge capacity in relation to the corresponding battery cell voltage during the electric power event. The measured charge-capacity-derivative is compared with a preferred anode charge-capacity-derivative of an anode charge curve (for electric power discharge events) or an anode discharge curve (for electric power charge events), and with a preferred cathode charge-capacity-derivative of a cathode charge curve (for electric power charge events) or a cathode discharge charge curve (for electric power discharge events). A first state of health parameter of the battery cell corresponding to the comparison of the measured charge-capacity-derivative with the preferred anode charge-capacity-derivative of the anode curve is determined. And, a second state of health parameter of the battery cell corresponding to the comparison of the measured charge-capacity-derivative with the preferred cathode charge-capacity-derivative of the cathode curve is determined.

21 Claims, 4 Drawing Sheets

METHOD AND APPARATUS FOR ASSESSING BATTERY STATE OF HEALTH

TECHNICAL FIELD

This disclosure is related to monitoring lithium-ion battery systems.

BACKGROUND

The statements in this section merely provide background information related to the present disclosure and may not constitute prior art.

Lithium-ion batteries are employed to provide high power and high energy densities in portable applications including, e.g., mobile devices, computing devices, and propulsion systems for vehicles. Power and energy management of lithium-ion batteries relies upon accurate determination of battery parameters including state of charge (SOC) and state of health (SOH) in real-time. Known systems for determining SOC and SOH may include an adaptive algorithm to provide real time prediction of SOC and SOH with associated errors due to inaccuracies in estimating the SOC.

SOC refers to stored electrical charge of a battery system, indicating available electric power for work relative to that which is available when the battery is fully charged. SOC may be viewed as a thermodynamic quantity, enabling one to assess the potential energy of the system. SOC may be used for purposes of regulating power flow from the battery pack to generate mechanical work, balanced with mechanical power originating from an internal combustion engine.

To better control the propulsion battery systems in vehicles for long battery life and good fuel economy, onboard systems determine and process battery parameters such as the open-circuit voltage (OCV), battery ohmic resistance, battery capacitance, and other parameters to determine SOC. However, OCV and other battery internal parameters are not directly measurable during vehicle operation.

It is known in the art to use a predetermined calibration table to regulate a battery pack, which has pre-determined parameters that are based on a standard vehicle or an experimental vehicle. It is known to use Coulomb counting to determine an SOC value of a battery system. Coulomb counting may be implemented when an initial SOC and a current efficiency is known, which may have inaccuracies. It is known to use differential voltage analysis, i.e., dV/dQ vs. V, to determine the source of capacity fade for lithium-ion batteries. It is known to use differential charge analysis, i.e., dQ/dV vs. Q, to determine the capacity fade for lithium-ion batteries and to quantify the composition change in materials.

SUMMARY

A method for monitoring a lithium-ion battery cell includes monitoring a battery cell voltage and a corresponding charge capacity of the battery cell during an electric power event which may include either an electric power charge event or an electric power discharge event. A measured charge-capacity-derivative is determined by differentiating the charge capacity in relation to the corresponding battery cell voltage during the electric power event. The measured charge-capacity-derivative is compared with a preferred anode charge-capacity-derivative of an anode charge curve (for electric power discharge events) or an anode discharge curve (for electric power charge events), and with a preferred cathode charge-capacity-derivative of a cathode charge curve (for electric power charge events) or a cathode discharge curve (for electric power discharge events). A first state of health parameter of the battery cell corresponding to the comparison of the measured charge-capacity-derivative with the preferred anode charge-capacity-derivative of the anode curve is determined. And, a second state of health parameter of the battery cell corresponding to the comparison of the measured charge-capacity-derivative with the preferred cathode charge-capacity-derivative of the cathode curve is determined.

BRIEF DESCRIPTION OF THE DRAWINGS

One or more embodiments will now be described, by way of example, with reference to the accompanying drawings, in which.

DETAILED DESCRIPTION

Figure 1:
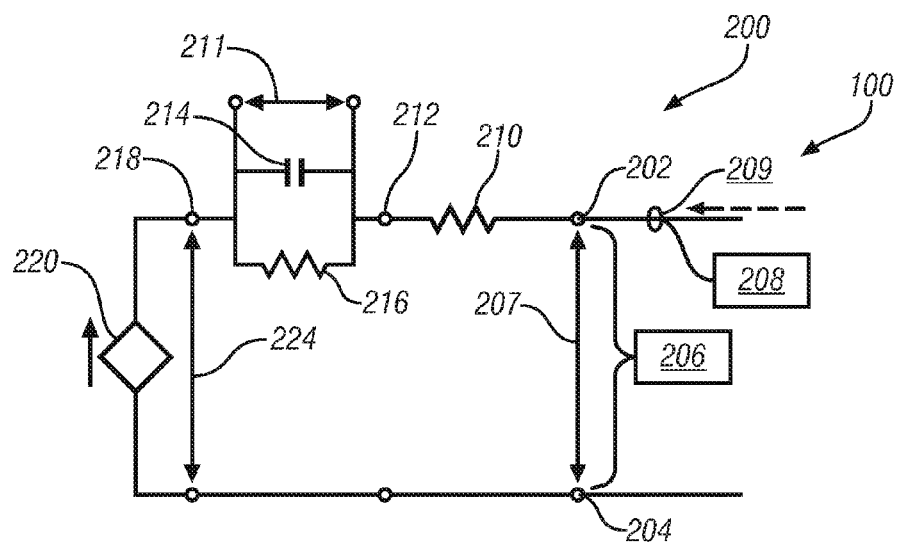
FIG. 1 is a schematic diagram of an equivalent circuit of a lithium-ion battery cell, in accordance with the disclosure.

Referring now to the drawings, wherein the showings are for the purpose of illustrating certain exemplary embodiments only and not for the purpose of limiting the same, FIG. 1 schematically shows a diagram of an equivalent circuit (or model) 200 of a lithium-ion battery cell 100. The equivalent circuit 200 has a first node 202 and a second node 204, with a measurable battery voltage 207 (V) existing between the nodes. The first node 202 corresponds to a cathode (positive) electrode preferably fabricated from $FePO_4$, e.g., a graphite-$FePO_4$ cell. The second node 204 corresponds to an anode (negative) electrode preferably fabricated from graphite, e.g., a graphite-$FePO_4$ cell. A voltage device 206, such as a voltmeter, may be disposed between the first node 202 and the second node 204 to obtain a reading of the measured battery voltage 207 (V). An electric current measuring device 208 measures an electric current 209 (I) at first node 202. Electrical current flowing into the first node 202 represents a positive charging current for equivalent circuit 200. The dashed arrow represents this positive charging current.

The equivalent circuit 200 includes a series resistance 210 (R) disposed between a third node 212 and first node 202. A capacitance 214 (C) arranged in parallel with a resistance 216 (Rct) are disposed between third node 212 and a fourth node
}

218. Capacitance 214 (C) represents an internal double layer capacitance of the battery model. Resistance 216 (Rct) represents a charge transfer resistance of the battery model. The voltage 211 across capacitance 214 and resistance 216 is referred to as a double layer voltage (Vdl) and is an internal voltage that cannot be readily measured in a practical battery. There may also be a contribution to the open circuit voltage due to hysteresis in the battery cell 100, by which past electrical currents influence the magnitude of the open circuit voltage (OCV).

The equivalent circuit 200 includes a battery voltage source 220 disposed between the fourth node 218 and the second node 204. The open circuit voltage 224 (OCV) is defined between fourth node 218 and second node 204, and represents an open terminal voltage of the battery voltage source 220, which cannot be readily measured under normal operating conditions because the battery voltage source 220 is connected to an electrical system. The measured battery voltage (V) 207 may be represented by the relationship:

$$V = OCV + Vdl + IR \quad [1]$$

A control module may be suitably configured to determine battery parameters for the lithium-ion battery cell 100 based upon measurable battery parameters, namely, the measured battery voltage (V) 207, the measured current 209 (I) and a measured battery temperature.

During a discharging event of a lithium battery, e.g., the battery cell 100, lithium ions are moving from the anode electrode to the cathode electrode. Thus, the cathode electrode is discharging by a lithium intercalation process and the anode electrode is charging by a lithium deintercalation process. During a charging event of the lithium battery cell 100, lithium ions are moving from the cathode electrode to the anode electrode. Thus, the cathode electrode is charging by a lithium deintercalation process and the anode electrode is discharging by a lithium intercalation process.

The relationship between battery voltage $V_{battery}$, cathode voltage $V_{cathode}$ and anode voltage $V_{anode}$ may be expressed as follows.

$$V_{battery} = V_{cathode} - V_{anode} \quad [2]$$

A derivative as a function of the charge storage, Q may be expressed as follows.

$$\left[\frac{dV}{dQ}\right]_{battery} = \left[\frac{dV}{dQ}\right]_{cathode} - \left[\frac{dV}{dQ}\right]_{anode} \quad [3]$$

A differential curve technique is applied to directly monitor the state of health (SOH) of the lithium-ion battery cell 100. This includes analyzing derivatives of an OCV-SOC relationship of a battery cell during an extended discharge event, wherein OCV is the open circuit voltage and SOC is one of state of charge and a state of discharge of the battery cell. The differential curve technique provides information related to individual OCV-SOC behaviors of the cathode and the anode of the battery cell, and provides information related to a magnitude of active lithium loss. This information enhances the accuracy of SOC and SOH monitoring of the lithium-ion battery cell. The source of the cell aging may also be determined based upon the information related to the loss of cathode material, anode material and active lithium.

The differential curve technique includes determining one of a potential-derivative, i.e., dV/dQ vs. Q and an associated differential voltage curve, and a charge-capacity-derivative, i.e., dQ/dV vs. V and an associated differential charge curve. Either may be used to monitor the SOH of the battery cell by determining and analyzing distinctive signature peaks from the respective differential voltage or charge curve. The signature peaks in the differential voltage curve relate to phase transitions of the electrode materials. The signature peaks in the differential charge curve indicate the phase equilibria of the electrode materials.

The electrochemical behaviors of each of the cathode and the anode are deconvoluted from charge/discharge characteristics of the battery cell and quantified based upon the magnitude and voltage position shifting of peaks identified in either of the differential curves. As capacity of the battery cell fades, information on loss of cathode material, anode material and active lithium is obtained.

Figure 2:
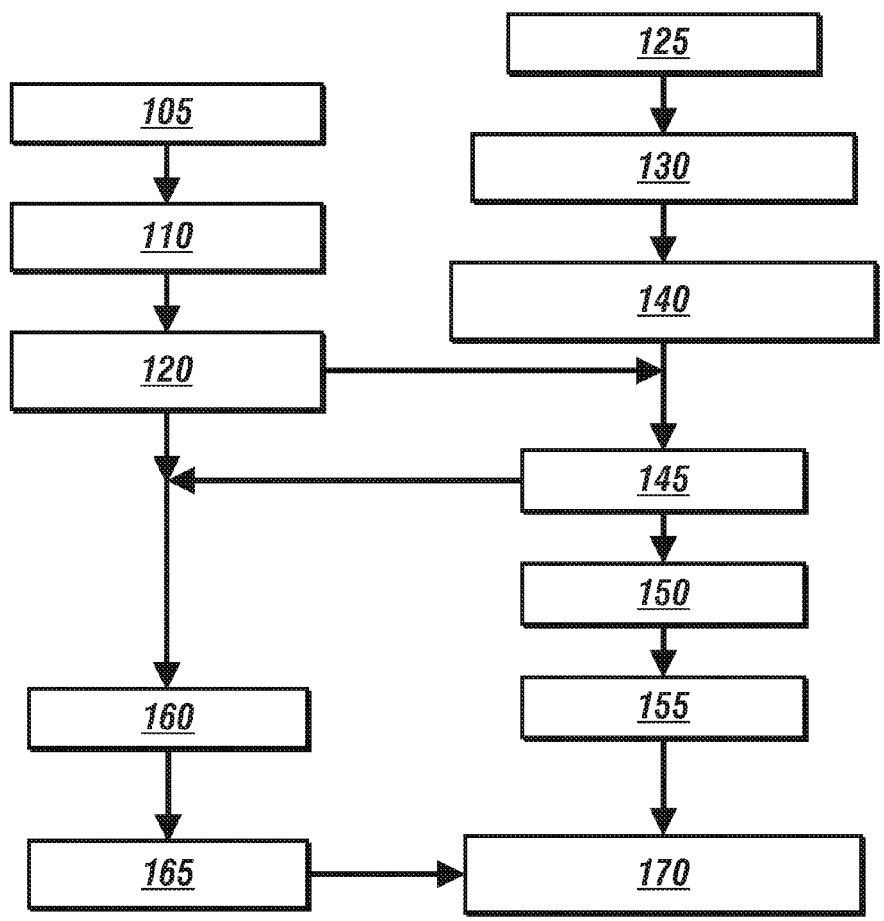
FIG. 2 schematically shows a flowchart depicting a process for monitoring and evaluating components that affect SOH of the battery cell using a differential curve technique, in accordance with the disclosure.

FIG. 2 schematically shows a flowchart depicting a process for monitoring and evaluating components that affect SOH of the battery cell 100 using a differential curve technique. It is appreciated that there are three measurable components that affect SOH of a battery cell, including a cathode capacity, an anode capacity, and an amount of active lithium. The process depicted in the flowchart is useful to extract the cathode capacity, the anode capacity, and the amount of active lithium in a battery cell, and is described with reference to the battery cell 100 described in FIG. 1. The terms cell, battery and battery cell are used interchangeably throughout.

Table 1 is provided as a key for the flowchart set forth in FIG. 2, wherein the numerically labeled blocks and the corresponding functions are set forth as follows.

TABLE 1

| FIG. 2 | |
|---|---|
| BLOCK | BLOCK CONTENTS |
| 105 | Develop calibration on new battery cell |
| 110 | Measure data, determine a cathode discharge response curve and an anode charge response curve |
| 120 | Determine preferred cathode potential-derivative and preferred anode potential-derivative |
| 125 | Monitor SOH |
| 130 | Measure battery cell discharge to determine measured discharge voltage profile |
| 140 | Calculate measured potential-derivative |
| 145 | Compare measured potential-derivative with the preferred anode potential-derivative |
| 150 | Compare measured signature peaks to determine total anode capacity |
| 155 | Calculate total anode capacity |
| 160 | Evaluate cathode Compare measured potential-derivative with the preferred cathode potential-derivative |
| 165 | Determine total cathode capacity |
| 170 | Determine SOH associated with losses of cathode, anode, and active lithium |

The flowchart includes developing a calibration (105) to determine relationships of the positive and negative electrodes for developing an ideal calibration curve for an embodiment of the battery cell having a mixed oxide cathode and a graphite anode. The calibration (105) to determine relationships of the positive and negative electrodes for developing ideal calibration curve(s) may be developed on a representative battery cell and implemented for purposes of monitoring and controlling other battery cells in use.

A calibration process for a new battery cell includes measuring battery parameters correlated with charge/discharge characteristics of the mixed-oxide cathode and the graphite anode against a known counter electrode, e.g., a lithium metal (110). The measured and analyzed battery parameters to determine charge/discharge characteristics for an exemplary battery are described with reference to FIG. 3, with OCV indicating the open circuit voltage, which is determined as described with reference to FIG. 1 and SOC and Q indicating a state of charge or charge capacity of the battery. The measured data includes a cathode discharge response curve 340 and an anode charge response curve 345, which are shown with reference to FIG. 3.

Figure 3:
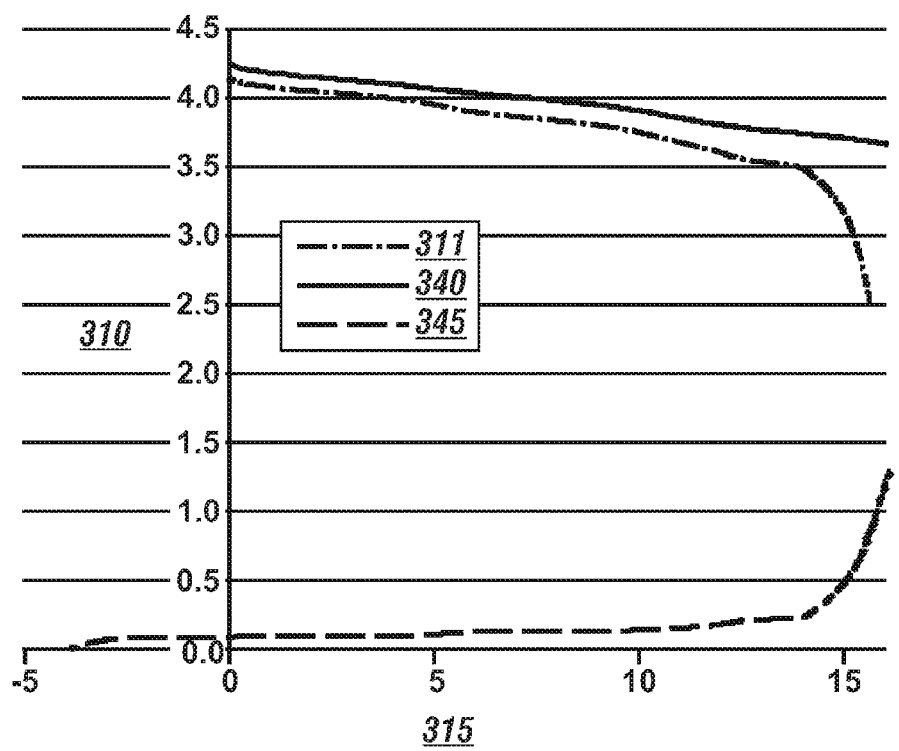
FIG. 3 is a graphical plot of data associated with charge/discharge characteristics for an exemplary battery cell including a full cell discharge, a cathode discharge response curve vs. lithium, and an anode charge response curve vs. lithium, in accordance with the disclosure.

FIG. 3 is a graphical plot of data associated with charge/discharge characteristics for an exemplary battery cell, including electrical potential V (310) shown on the y-axis plotted in relation to a charge capacity (315) shown on the x-axis. The data is illustrative. Depicted data include full cell discharge 311, a cathode discharge response curve 340 of the cathode of the new battery cell vs. lithium, and an anode charge response curve 345 of the anode of the new battery cell vs. lithium. The charge/discharge characteristics are measured at a slow charge/discharge rate (e.g., <C/20) to obtain equilibrium curves, yielding half-cell data, i.e., one of the cathode and the anode, OCV-SOC curves that depict OCV-SOC relations of the cathode and the anode for the new battery cell, i.e., the cathode discharge response curve 340 and the anode charge response curve 345.

Derivatives of the cathode discharge response curve 340 and the anode charge response curve 345 are also determined and correlated to the SOC (120). Derivatives may include the potential-derivative of the electric potential calculated for the differential voltage, i.e., dV/dQ vs. Q, or, alternatively, the charge-capacity-derivative of the electric charge capacity calculated for the differential charge, i.e., dQ/dV vs. V.

Preferred signature peaks associated with the derivatives of the cathode discharge response curve 340 and the anode charge response curve 345 are identified and used in subsequent evaluations. By taking the derivatives of the cathode discharge response curve 340 and the anode charge response curve 345, signature peaks may be captured that are representative of the cathode and the anode.

Figure 4:
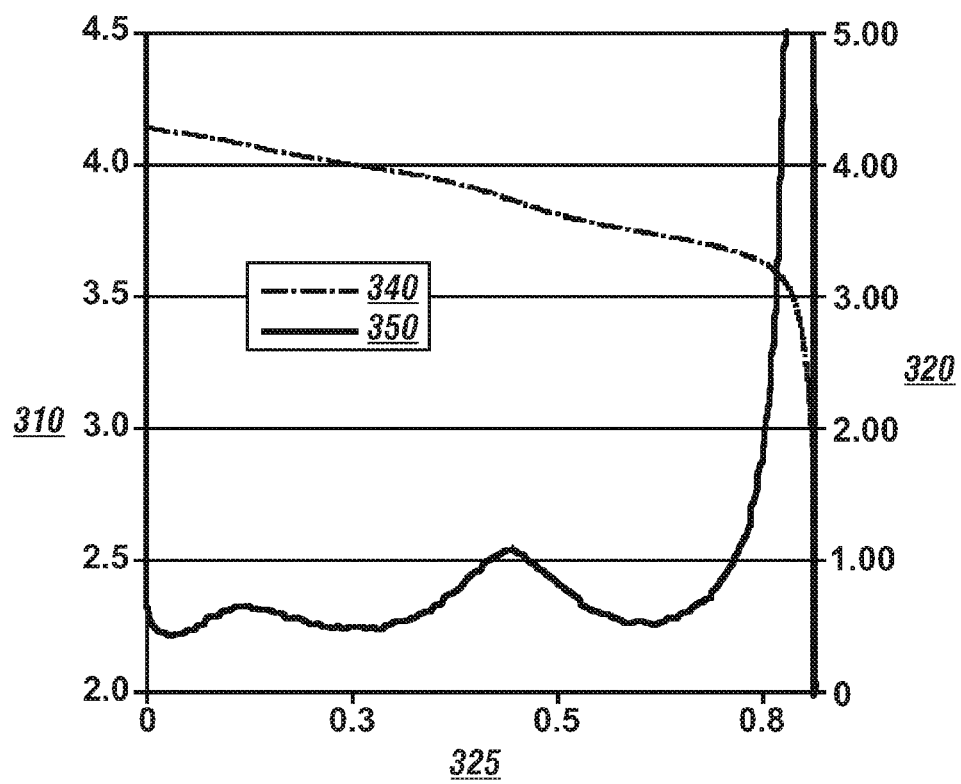
FIG. 4 is a graphical plot of a cathode discharge response curve and a corresponding preferred cathode potential-derivative in accordance with the disclosure.

FIG. 4 is a graphical plot of electrical potential V (310) and a potential-derivative of the electric potential dV/dQ (320), both shown on the y-axis, plotted against discharge capacity (325), which is shown on the x-axis. The discharge capacity (325) may be in units of amp-hours, or normalized to 100% discharge, or other suitable units. Depicted data includes cathode discharge response curve 340 and a corresponding preferred cathode differential voltage curve 350, also referred to as preferred cathode discharge-derivative 350. The preferred cathode differential voltage curve 350 is a potential-derivative of the cathode discharge response curve 340, which provides a characteristic electrical potential response for the mixed-oxide cathode discharge against the known counter electrode, i.e., dV/dQ vs. SOC of the cathode discharge.

Figure 5:
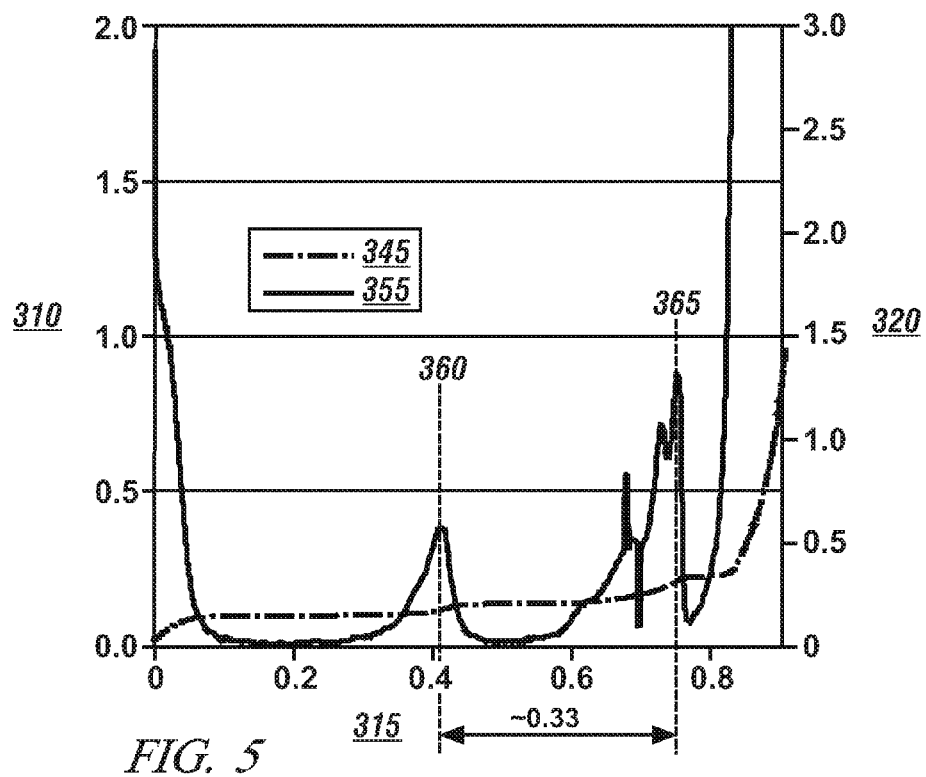
FIG. 5 is a graphical plot of an anode charge response curve and a corresponding preferred anode potential-derivative, in accordance with the disclosure.

FIG. 5 is a graphical plot of electrical potential V (310) and a potential-derivative of the electric potential dV/dQ (320), both shown on the y-axis, plotted against charge capacity (315), which is shown on the x-axis. The charge capacity (315) may be in units of amp-hours, or normalized to 100% charge, or other suitable units. Depicted data includes the anode charge response curve 345 and a corresponding preferred anode differential voltage curve 355, also referred to as a preferred anode potential-derivative 355. The preferred anode differential voltage curve 355 is a potential-derivative of the anode charge response curve 345. The preferred anode potential-derivative 355, i.e., dV/dQ vs. SOC of the anode charge has two peaks 360 and 365 that are located at points on the charge capacity (315) that differ by approximately 0.33, or 33% of the total normalized charge capacity, and is referred to herein as a preferred total anode capacity. It is appreciated that the two peaks 360 and 365 and their difference is meant to be illustrative only. The peaks 360 and 365 may be identified as the preferred signature peaks for the graphite anode 360 and 365, and employed for evaluating health of the battery cell during ongoing operation.

Alternatively, the OCV-SOC curves may be analyzed using the charge-capacity-derivative, i.e., dQ/dV vs. V. Signature peaks for the potential-derivative, i.e., dV/dQ vs. Q correspond to phase transitions in the electrode materials, whereas signature peaks for the charge-capacity-derivative dQ/dV vs. V indicate phase equilibria of the electrode materials.

Referring again to FIG. 2, during ongoing operation a state of health (SOH) of the battery is monitored during an electric power event (125). The method is described with reference to gathering battery data during an electric power event that is primarily a battery discharge event to generate a discharge voltage profile. An exemplary battery discharge event occurs during operation of a hybrid or electrically-powered vehicle when battery power is used for vehicle propulsion. The method applies equally to gathering battery data during an electric power event that is primarily a battery charge event to generate a charge voltage profile. This includes using the preferred cathode potential-derivative 350 shown in FIG. 4 and the preferred anode potential-derivative 355 shown in FIG. 5.

Discharge of the battery cell is measured during operation that includes a low rate of discharge to determine a measured discharge voltage profile. Measured data associated with the discharge of the battery cell are described in Table 2 (130).

TABLE 2

| Time | Current | Voltage | Temp | OCV | SOC, Q |
|------|---------|---------|------|-----|--------|
| (Sec) | (Amps) | (V) | (C.) | (V) | (Ah) |

The measured data includes measuring battery parameters across the terminals of the battery cell during an extended discharge event, including current 208 and voltage 207 and a battery temperature (Temp) as a function of elapsed time as described with reference to FIG. 1. It is appreciated that data associated with charging of the battery cell may be measured at a low rate of battery charge to determine a measured charge voltage profile using the same data as described in Table 2.

The measured battery parameters are used to determine a measured discharge voltage profile that is correlated to the state of charge Q, i.e., OCV vs. Q, wherein OCV is the open-circuit voltage and Q is the state of charge (130). An example extended discharge event may include a discharge event from greater than 80% SOC to less than 20% SOC. A battery state estimator may be applied to the measured battery parameters to estimate the battery states including the open-circuit voltage OCV and the state of charge Q. Battery state estimators are known and not described in detail herein.

A measured potential-derivative (dV/dQ vs. Q) is calculated from the measured discharge voltage profile of the battery, preferably using differential analysis methods (140).

Signature peaks for the graphite anode electrode are identified by comparing the measured potential-derivative (dV/dQ vs. Q) derived from the measured discharge voltage profile of the battery cell with the preferred anode potential-derivative 355, i.e., dV/dQ vs. SOC of the anode electrode (145). This is shown in FIG. 6.

Figure 6:
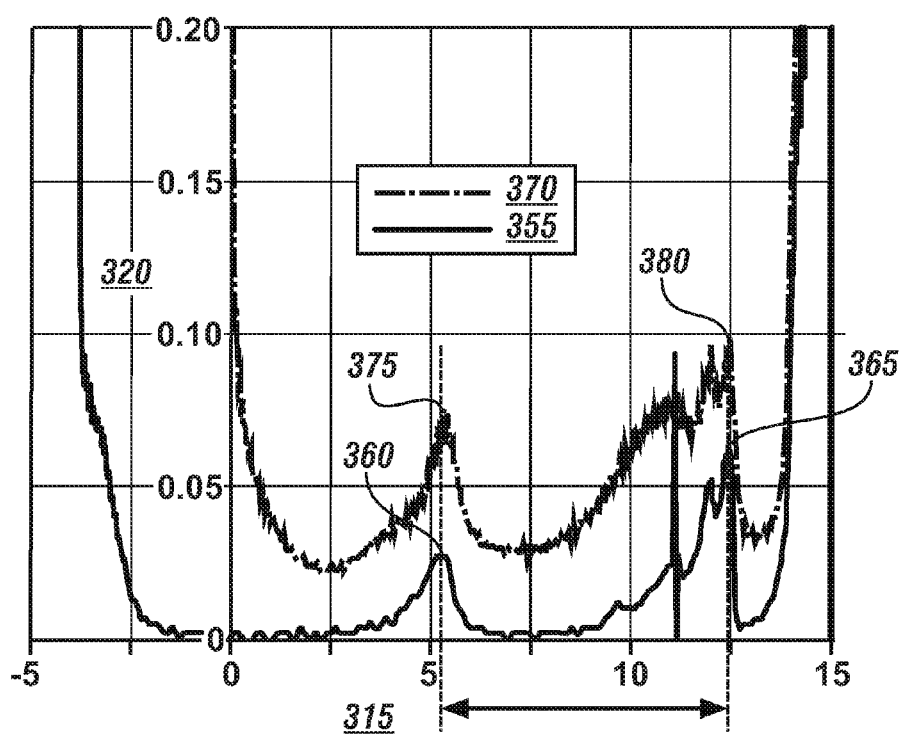
FIG. 6 is a graphical plot of the preferred anode potential-derivative 355 and measured potential-derivative calculated from a measured discharge voltage profile of a battery cell, in accordance with the disclosure.

FIG. 6 is a graphical plot of the potential-derivative of the electric potential dV/dQ (320), shown on the y-axis, plotted against the charge capacity (315), which is shown on the x-axis. The depicted data includes the preferred potential-derivative 355 of an anode charge curve and the measured potential-derivative of a cell discharge curve (dV/dQ vs. Q) 370 that is calculated from the measured discharge voltage profile of the battery cell. The preferred anode potential-derivative 355 includes preferred signature peaks 360 and 365 of an anode. The measured potential-derivative of the cell discharge curve (dV/dQ vs. Q) 370 includes measured signature peaks 375 and 380.

Referring again to FIG. 2, the measured potential-derivative of the cell discharge curve 370 calculated from the measured discharge voltage profile of the battery also includes the two measured signature peaks 375 and 380, which are identified and shown with reference to FIG. 6 (145). The distance between the signature peaks 375 and 380, preferably measured in units of Amp-hours or another suitable metric, represents a fraction (e.g. 33%) of the total anode capacity. A total measured anode capacity is thus determined.

The measured signature peaks 375 and 380 in the measured charge-derivative 370 are quantitatively compared with the preferred signature peaks 360 and 365 of the preferred potential-derivative of the anode charge curve 355 to determine total anode capacity (150). Quantitatively comparing the measured signature peaks includes comparing the total measured anode capacity for the measured signature peaks with the preferred total anode capacity, with the comparison preferably made in units of Amp-hours difference between the signature peaks. Quantitatively comparing the measured signature peaks also includes aligning one of the measured signature peaks, e.g., peak 380, with a corresponding one of the preferred signature peaks for the preferred anode charge-derivative 355, e.g., peak 365, to determine the position of the anode electrode with respect to the complete battery cell.

Quantitatively comparing the measured signature peaks 375 and 380 in the measured potential-derivative 370 with the preferred signature peaks 360 and 365 of the preferred anode potential-derivative 355 further includes aligning the respective peaks to determine the position of the anode with reference to the battery cell, which permits deconvoluting the OCV-SOC relationship of the anode in relation to the battery cell.

A total graphite anode capacity may be calculated as a ratio of the total anode capacity for the measured signature peaks and the preferred total anode capacity (155). The total graphite anode capacity is useable as an indicator of graphite anode loss. A shift in the positions of one or both of the measured signature peaks in relation to the preferred signature peaks 360 and 365 for the graphite anode is calculated, and is an indication of lithium loss and total capacity loss when compared to the preferred total anode capacity. Shrinkage in distance between the signature peaks reflects graphite anode loss. A leftward shift of the positions of the peaks, excluding shrinkage, indicates an amount of lithium loss or total capacity loss. Suitable analytical processes, e.g., ratiometric comparisons, may be employed to calculate parameters correlatable to the total graphite anode capacity, the lithium loss and the total capacity loss.

Measurements associated with the cathode are also evaluated, including quantitatively comparing a measured potential-derivative with the preferred cathode potential-derivative (160). This includes comparing measured signature peaks in the potential-derivative with preferred signature peaks to determine a total cathode capacity (165). This includes calculating the OCV-SOC relationship of the cathode electrode using the previously determined cell discharge voltage, i.e., the data associated with Table 2, and a deconvoluted OCV-SOC relationship of the anode in relation to the battery cell, i.e., $V_{anode}$(SOC) described herein.

A cathode voltage response is determined by adding the cell voltage, i.e., OCV or $V_{battery}$(SOC), and the deconvoluted anode voltage $V_{anode}$(SOC) together at each specific SOC for the data described with reference to Table 2.

The cathode voltage response is described by the following arithmetic relationship.

$$V_{cathode}(SOC)=V_{battery}(SOC)+V_{anode}(SOC) \quad [4]$$

Similarly, the potential-derivative for the cathode voltage response may be determined as follows.

$$dV/dQ_{cathode}=dV/dQ_{battery}+dV/dQ_{anode} \quad [5]$$

The measurements associated with the cathode are evaluated, including quantitatively comparing the measured potential-derivative for the cathode voltage response, i.e., $dV/dQ_{cathode}$ with the preferred cathode potential-derivative of a discharge curve 350. Illustrative data is shown with reference to FIG. 7.

Figure 7:
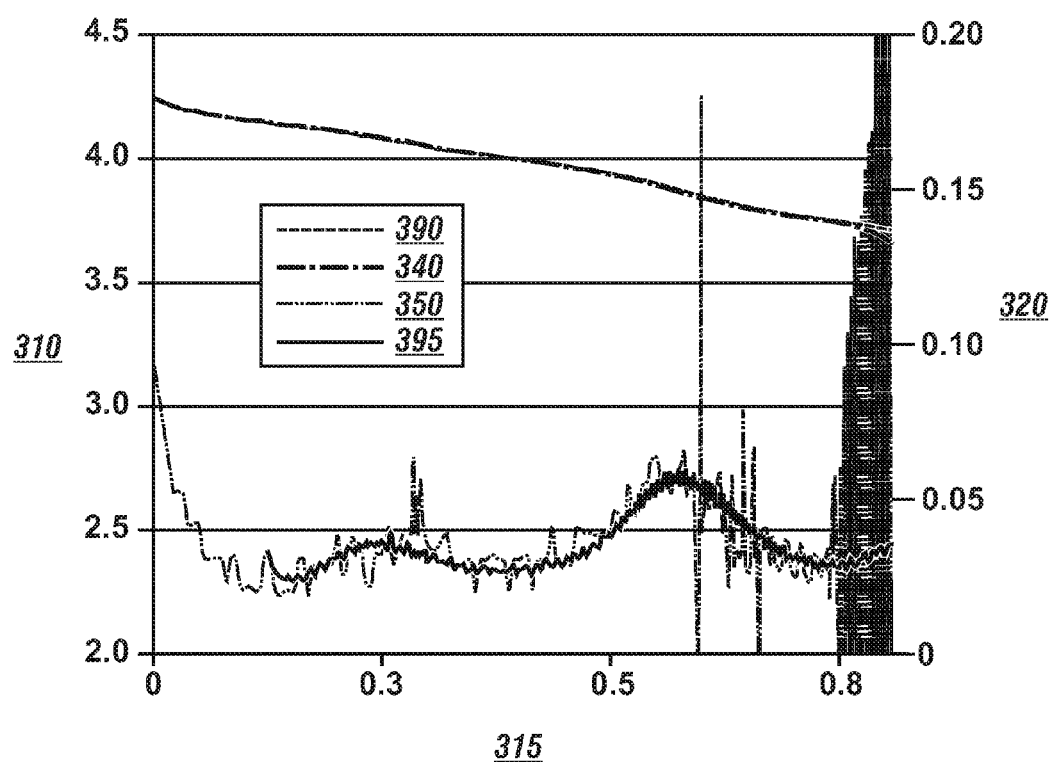
FIG. 7 is a graphical plot of the preferred cathode discharge response curve and the preferred cathode potential-derivative, a measured cathode discharge response curve and the measured cathode potential-derivative, in accordance with the disclosure.

FIG. 7 is a graphical plot of a potential-derivative of the electric potential dV/dQ (320) and electric potential V (310), shown on the y-axis, plotted against the discharge capacity (330), which is shown on the x-axis. The depicted data includes the preferred calculated cathode discharge response curve 340 and the preferred calculated cathode potential-derivative 350. The depicted data also includes the measured cathode discharge response curve 390 and the measured cathode differential voltage curve 395, both of which are calculated from the measured discharge voltage profile of the exemplary battery 370, i.e., $V_{battery}$(SOC) and the negative electrode voltage $V_{anode}$(SOC) together at each specific SOC for the measured data that has been obtained as described with reference to Table 2.

During in-use operation of the battery cell, changes in position and size of the peaks at the anode and the cathode are monitored using the differential dV/dQ analysis. Capacity fading behaviors of the anode and the cathode and information on the active lithium loss are determined by monitoring the shifting in peak position(s), shrinking magnitude of the peaks, and shrinking in distance between the peaks.

The method described with reference to FIG. 2 may also be applied to monitor the lithium-ion battery cell 100 during an electric power charging event. This includes monitoring the battery voltage and a corresponding state of charge of the battery cell during the charging event, as described with reference to Table 2 using analytical methods that are analogous to those described with reference to FIG. 2. A measured potential-derivative is determined by differentiating the battery voltage in relation to the corresponding state of charge of the battery during the electric power charge event. The measured potential derivative is compared with a preferred anode potential-derivative of the anode discharge curve. The measured potential derivative is also compared with a preferred cathode potential-derivative of the cathode charge curve. A first state of health parameter of the lithium-ion battery cell may be determined, and corresponds to the comparison of the measured potential-derivative with the preferred potential-derivative of the anode discharge curve. A second state of health parameter of the lithium-ion battery cell may be determined, and corresponds to the comparison of the measured potential-derivative with the preferred cathode potential-derivative of the cathode charge curve.

Alternatively or in addition, monitoring the lithium-ion battery cell includes monitoring battery voltage and a corresponding charge capacity of the battery cell during either electric power charge event or an electric power discharge event, as previously described with reference to the data described in Table 2, using analytical methods that are analogous to those described with reference to FIG. 2. A measured charge-capacity-derivative may be determined by differentiating the charge capacity in relation to the corresponding battery voltage during the electric power event. The measured charge-capacity-derivative is compared with a preferred charge-capacity-derivative of an anode curve. The measured charge-capacity-derivative is compared with a preferred charge-capacity-derivative of a cathode curve. A first state of health parameter of the lithium-ion battery cell is determined and corresponds to the comparison of the measured charge-capacity-derivative with the preferred charge-capacity-derivative of the anode curve. A second state of health parameter of the lithium-ion battery cell is determined that corresponds to the comparison of the measured charge-capacity-derivative with the preferred charge-capacity-derivative of the cathode curve. Comparing the measured charge-capacity-derivative with the preferred charge-capacity-derivative of the anode curve may include identifying preferred signature peaks of the preferred charge-capacity-derivative of the anode curve, identifying measured signature peaks of the measured charge-capacity-derivative, and determining an anode capacity corresponding to the measured signature peaks relative to the preferred signature peaks. In addition, comparing the measured charge-capacity-derivative with the preferred charge-capacity-derivative of the cathode curve may include integrating the measured charge-capacity-derivative, integrating the preferred charge-capacity-derivative of the cathode curve, and comparing the integrated measured charge-capacity-derivative with the preferred charge-capacity-derivative of the cathode curve.

Referring again to FIG. 2, a total cathode capacity may be determined as a ratio of a total cathode capacity for the measured signature peaks and a preferred total cathode capacity (165). The total cathode capacity is useable as an indicator of cathode material loss.

This analysis permits a determination of SOH of the battery in terms of a loss of cathode electrode, a loss of anode electrode, and a loss of active lithium, which indicates a total capacity loss (170).

The process for monitoring and evaluating components that affect SOH of the battery cell 100 using a differential curve technique described herein is preferably executed using algorithms and predetermined calibrations stored in an on-vehicle control module.

Control module, module, control, controller, control unit, processor and similar terms mean any suitable one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs, combinational logic circuit(s), input/output circuit(s) and devices, appropriate signal conditioning and buffer circuitry, and other suitable components to provide the described functionality. The control module has a set of control algorithms, including resident software program instructions and calibrations stored in memory and executed to provide the desired functions. The algorithms are preferably executed during preset loop cycles. Algorithms are executed, such as by a central processing unit, and are operable to monitor inputs from sensing devices and other networked control modules, and execute control and diagnostic routines to control operation of actuators. Loop cycles may be executed at regular intervals, for example each 3.125, 6.25, 12.5, 25 and 100 milliseconds during ongoing engine and vehicle operation. Alternatively, algorithms may be executed in response to occurrence of an event.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Method for monitoring a lithium-ion battery cell, comprising:
monitoring battery cell voltage and a corresponding charge capacity of the battery cell during an electric power event comprising one of an electric power charge event and an electric power discharge event;
determining a measured charge-capacity-derivative by differentiating the charge capacity in relation to the corresponding battery cell voltage during the electric power event;
comparing the measured charge-capacity-derivative with a preferred anode charge-capacity-derivative of an anode curve;
comparing the measured charge-capacity-derivative with a preferred cathode charge-capacity-derivative of a cathode curve;
determining a first state of health parameter of the battery cell corresponding to the comparison of the measured charge-capacity-derivative with the preferred anode charge-capacity-derivative of the anode curve; and
determining a second state of health parameter of the battery cell corresponding to the comparison of the measured charge-capacity-derivative with the preferred cathode charge-capacity-derivative of the cathode curve.

2. The method of claim 1, wherein:
said electric power event comprises an electric power discharge event;
said anode curve comprises an anode charge curve; and
said cathode curve a cathode discharge curve.

3. The method of claim 2, wherein comparing the measured charge-capacity-derivative with the preferred anode charge-capacity-derivative of the anode charge curve comprises:
identifying measured signature peaks of the measured charge-capacity-derivative; and
determining a total measured anode capacity comprising a charge capacity difference between the measured signature peaks of the measured charge-capacity-derivative.

4. The method of claim 3, further comprising
identifying preferred signature peaks of the preferred anode charge-capacity-derivative of the anode charge curve; and
determining a preferred total anode capacity comprising a charge capacity difference between the preferred signature peaks of the preferred anode charge-capacity-derivative;
wherein determining the first state of health parameter of the battery cell corresponding to the comparison of the measured charge-capacity-derivative with the preferred anode charge-capacity-derivative of the anode charge curve comprises determining a total graphite anode capacity by comparing the total measured anode capacity and the preferred total anode capacity.

5. The method of claim 2, wherein comparing the measured charge-capacity-derivative with the preferred anode charge-capacity-derivative of the anode charge curve comprises:
identifying preferred signature peaks of the preferred anode charge-capacity-derivative;

identifying measured signature peaks of the measured charge-capacity-derivative; and determining a shift in the measured signature peaks relative to the preferred signature peaks.

6. The method of claim 5, wherein determining the first state of health parameter of the battery cell corresponding to the comparison of the measured charge-capacity-derivative with the preferred anode charge-capacity-derivative of the anode charge curve comprises determining a magnitude of lithium loss and total capacity loss of the battery cell corresponding to the shift in the measured signature peaks relative to the preferred signature peaks.

7. The method of claim 2, wherein comparing the measured charge-capacity-derivative with the preferred cathode charge-capacity-derivative of the cathode discharge curve comprises:

determining a charge-capacity-derivative for a cathode voltage response based upon the comparison of the measured charge-capacity-derivative with the preferred anode charge-capacity-derivative; and comparing the charge-capacity-derivative for the cathode voltage response with the preferred cathode charge-capacity-derivative.

8. The method of claim 2, wherein the electric power discharge event comprises a discharge of the battery cell from a state of charge greater than 80% to a state of charge less than 20%.

9. The method of claim 2, wherein comparing the measured charge-capacity-derivative with the preferred anode charge-capacity-derivative of the anode charge curve comprises comparing the measured charge-capacity-derivative with an anode charge-capacity-derivative of an anode charge curve for a new battery cell, the anode charge-capacity-derivative of the anode charge curve for the new battery cell determined by measuring battery parameters correlated to the anode against a lithium electrode during a discharge event of the new battery cell.

10. The method of claim 2, wherein comparing the measured charge-capacity-derivative with the preferred cathode charge-capacity-derivative of the cathode discharge curve comprises comparing the measured charge-capacity-derivative with a cathode charge-capacity-derivative of a cathode discharge curve for a new battery cell, the cathode charge-capacity-derivative of the cathode discharge curve for the new battery cell determined by measuring battery parameters correlated to the cathode against a lithium electrode during a discharge event of the new battery cell.

11. The method of claim 2, wherein comparing the measured charge-capacity-derivative with the preferred cathode charge-capacity-derivative of the cathode discharge curve comprises integrating the measured charge-capacity-derivative, integrating the preferred cathode charge-capacity-derivative of the cathode discharge curve, and comparing the integrated measured charge-capacity-derivative with the integrated preferred cathode charge-capacity-derivative of the cathode discharge curve.

12. The method of claim 1, wherein:

said electric power event comprises an electric power charge event;

said anode curve comprises an anode discharge curve; and said cathode curve comprises a cathode charge curve.

13. The method of claim 12, wherein comparing the measured charge-capacity-derivative with the preferred anode charge-capacity-derivative of the anode discharge curve comprises:

identifying measured signature peaks of the measured charge-capacity-derivative; and determining a total measured anode capacity comprising a charge capacity difference between the measured signature peaks of the measured charge-capacity-derivative.

14. The method of claim 13, further comprising identifying preferred signature peaks of the preferred anode charge-capacity-derivative of the anode discharge curve; and determining a preferred total anode capacity comprising a charge capacity difference between the preferred signature peaks of the preferred anode charge-capacity-derivative;

wherein determining the first state of health parameter of the battery cell corresponding to the comparison of the measured charge-capacity-derivative with the preferred anode charge-capacity-derivative of the anode discharge curve comprises determining a total graphite anode capacity by comparing the total measured anode capacity and the preferred total anode capacity.

15. The method of claim 12, wherein comparing the measured charge-capacity-derivative with the preferred anode charge-capacity-derivative of the anode discharge curve comprises:

identifying preferred signature peaks of the preferred anode charge-capacity-derivative;

identifying measured signature peaks of the measured charge-capacity-derivative; and determining a shift in the measured signature peaks relative to the preferred signature peaks.

16. The method of claim 15, wherein determining the first state of health parameter of the battery cell corresponding to the comparison of the measured charge-capacity-derivative with the preferred anode charge-capacity-derivative of the anode discharge curve comprises determining a magnitude of lithium loss and total capacity loss of the battery cell corresponding to the shift in the measured signature peaks relative to the preferred signature peaks.

17. The method of claim 12, wherein comparing the measured charge-capacity-derivative with the preferred cathode charge-capacity-derivative of the cathode charge curve comprises:

determining a charge-capacity-derivative for a cathode voltage response based upon the comparison of the measured charge-capacity-derivative with the preferred anode charge-capacity-derivative; and comparing the charge-capacity-derivative for the cathode voltage response with the preferred cathode charge-capacity-derivative.

18. The method of claim 12, wherein the electric power charge event comprises a charge of the battery cell from a state of charge less than 20% to a state of charge greater than 80%.

19. The method of claim 12, wherein comparing the measured charge-capacity-derivative with the preferred anode charge-capacity-derivative of the anode discharge curve comprises comparing the measured charge-capacity-derivative with an anode charge-capacity-derivative of an anode discharge curve for a new battery cell, the anode charge-capacity-derivative of the anode discharge curve for the new battery cell determined by measuring battery parameters correlated to the anode against a lithium electrode during a charge event of the new battery cell.

20. The method of claim 12, wherein comparing the measured charge-capacity-derivative with the preferred cathode charge-capacity-derivative of the cathode charge curve comprises comparing the measured charge-capacity-derivative with a cathode charge-capacity-derivative of a cathode charge curve for a new battery cell, the cathode charge-capacityderivative of the cathode charge curve for the new battery cell determined by measuring battery parameters correlated to the cathode against a lithium electrode during a charge event of the new battery cell.

21. The method of claim 12, wherein comparing the measured charge-capacity-derivative with the preferred anode charge-capacity-derivative of the anode charge curve comprises integrating the measured charge-capacity-derivative, integrating the preferred anode charge-capacity-derivative of the anode charge curve, and comparing the integrated measured charge-capacity-derivative with the integrated preferred anode charge-capacity-derivative of the anode charge curve.

* * * * *